(12) United States Patent
Lin

(10) Patent No.: US 6,239,383 B1
(45) Date of Patent: May 29, 2001

(54) BALL-GRID ARRAY IC PACKAGING FRAME

(75) Inventor: Patrick Lin, Taoyuan (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/286,003

(22) Filed: Apr. 5, 1999

(30) Foreign Application Priority Data

Sep. 5, 1998 (TW) ................................................ 87114763

(51) Int. Cl.⁷ ........................................................ H05K 1/16
(52) U.S. Cl. .................... 174/260; 174/255; 257/678; 257/690; 361/760; 361/752; 361/756
(58) Field of Search ................................ 174/260, 255; 361/770, 758, 760, 752, 756; 257/678, 690, 693, 698, 774; 438/106

(56) References Cited

U.S. PATENT DOCUMENTS

| | | | |
|---|---|---|---|
| 5,477,933 | * 12/1995 | Nguyen | 174/262 |
| 5,598,036 | * 1/1997 | Ho | 257/738 |
| 5,641,946 | * 6/1997 | Shim | 174/261 |
| 5,662,725 | * 9/1997 | Moore et al. | 361/735 |
| 5,716,222 | * 2/1998 | Murphy | 439/91 |
| 5,724,728 | * 3/1998 | Bond et al. | 29/840 |
| 5,751,556 | * 5/1998 | Butler et al. | 361/773 |
| 5,760,469 | * 6/1998 | Higashiguchi et al. | 257/678 |
| 5,985,695 | * 11/1999 | Freyman et al. | 438/112 |
| 6,014,318 | * 1/2000 | Takeda | 361/764 |

\* cited by examiner

Primary Examiner—Jeffrey Gaffin
Assistant Examiner—J B Patel
(74) Attorney, Agent, or Firm—Jiawei Huang; J. C. Patents

(57) ABSTRACT

A ball-grid array (BGA) IC packaging frame of the invention includes a plurality of ball-grid array tin balls formed on the rear surface of a BGA package and a plurality of supporting pads formed on the surrounding of the rear surface. The designed supporting pads can efficiently prevent a non-contact soldering and a short circuit when a BGA IC is mounted on a PCB during manufacturing.

21 Claims, 5 Drawing Sheets

US 6,239,383 B1

BALL-GRID ARRAY IC PACKAGING FRAME

CROSS-REFERENCE TO RELATED APPLICATION

This application claims the priority benefit of Taiwan application serial no. 87114763, filed Sep. 5, 1998, the full disclosure of which is incororated herein by reference.

BACKGROUND OF THE INVENTION

1. Field of the Invention

The invention relates to a ball-grid array (BGA) IC packaging frame, and in particular to a ball-grid array IC packaging frame having supporting pads for preventing non-contact soldering and short circuits.

2. Description of the Related Art

A ball-grid array (BGA) IC packaging, a novel IC packaging with a large number of pins, is suitable for sub-micron ultra-large scale integrated circuits. The more complicated the functions of ICs, the higher the integration of transistor-based ICs. Generally, the conventional quad flat pack (QFP) and pin-grid array (PGA), which commonly only provide about 100–200 pins for each packaging, cannot handle with current complicated digital logic ICs. That is, the QFP and PGA cannot meet practical requirements at all.

Today, 64-bit microprocessor-based personal computers (PCs) have been widely utilized. The core logic circuits of a PC are electrically connected to a microprocessor, DRAMs serving as main memories and SRAMs serving as fast access memories thereof by a 64-bit bus. When the core logic circuits are manufactured into an IC chip, at least approximate 200 pins are required for a data bus and a address bus. If other control signals are taken into consideration, the total number of pins required are easily over 300. In this case, the BGA IC packaging can meet the requirement for a large number of pins.

A ball-grid array packaging substrate is constituted by a small-size printed circuit board (PCB) based on a printed circuit technique. As known by those skilled in the art, a die is automatically mounted on the substrate by a pick-and-place machine after wafer sawing. Then, the bonding pads of the dice are connected to the corresponding IO pads of the substrate with wires by a wire-bonding machine. Next, the die including the bonding pads and IO pads is encapsulated with a plastic molding compound by a molding machine. After the plastic cools, a solder reflow treatment is performed to form several hundreds of tin balls on the rear surface of the substrate. Since logic circuits contained in a current IC have more various functions and the operating frequency thereof already reaches several hundreds of MHz, more number of IO pads and shorter lengths of wires between a die and pines are required to perform IC packaging. Accordingly, the BGA IC packaging has been mainly and widely utilized for packaging high-integration and high-speed ICs in recent years. The BGA IC packaging has the following advantages.

(1) More IO pads can be provided.

(2) IC packages having small sizes are suitable for small-size equipment, such as notebooks.

(3) Ground bounce is greatly reduced, especially for high-speed circuits due to small inductance between induced by shorter wires.

(4) Tin balls are utilized to electrically connect a PCB, instead of conventional lead pins. Therefore, the problem of pins bent or shifted during delivery can be completely eliminated.

However, several disadvantages exist in the BGA IC packaging. Referring to FIG. 1, a bottom view of a BGA IC package 10 according to the prior art is shown. A plurality of ball-grid array tin balls 14 is formed on the rear surface of the conventional BGA IC package 10. Since the BGA IC package 10 is used in coordination with surface-mount technology (hereinafter referred to as SMT) where tin balls are utilized for connection with a PCB instead of pins, requirements for packaging become stricter. The SMT is a method to mount a BGA IC chip on a PCB. Then, a nitrogen solder reflow treatment is performed to melt the tin balls 14 beneath the BGA IC package 10, making the BGA IC and PCB knitted together to form a functional system. At this time, if the temperature-time curve of the nitrogen solder reflow treatment is not well-controlled, a short circuit between two adjacent tin balls as shown in FIG. 2 or non-contact soldering as shown in FIG. 3 will occur.

Referring to FIG. 4, a poor contact between a BGA IC 16 and a PCB 18 is shown. can be obviously seen from FIG. 4, non-contact soldering 20 and a short circuit 22 occur on a first end and a second end of the BGA IC 16 where the first end is higher than the second end, because of having no supports, such as pins in PGA, to support the BGA IC 16. This is a disadvantage of the BGA IC packaging.

Further more, in the SMT, the BGA IC 16 is mounted on the PCB 18 thereby to allow tin balls beneath the BGA IC 16 to connect corresponding tin solders which was spread on the surface of the PCB pads. How ever, the tin solders on the PCB will be dissipated if the BGA IC 16 is placed down from a higher position or the tin solders are easily squeezed if the BGA IC 16 is placed down form a lower position. Either will put the tin solders on the PCB in an inappropriate collapsed soldering condition, resulting in short circuits or non-contact soldering. Moreover, the PCB is easily warped by heat, causing being unable to be stably placed. This results in a poor yield.

SUMMARY OF THE INVENTION

In view of the above, an object of the invention is to provide a ball-grid array (BGA) IC packaging frame for preventing non-contact soldering and short circuits. To attain the above-stated object, in a ball-grid array IC packaging frame according to the invention, a plurality of supports are formed on the rear surface of a BGA IC package where tin balls are located. As a result, a BGA IC packaged according to the invention does not have its one end higher than the other end when mounted on a PCB. Thus, non-contact soldering and short circuits can be completely prevented.

The ball-grid array IC packaging frame of the invention includes a plurality of ball-grid array tin balls formed on the rear surface of a ball-grid array IC package and a plurality of supporting pads formed on the surrounding of the rear surface of the ball-grid array IC packages.

BRIEF DESCRIPTION OF THE DRAWINGS

The invention will be more fully understood from the detailed description given hereinbelow and the accompanying drawings, which are given by way of illustration only, and thus do not limit the present invention, and wherein.

DETAILED DESCRIPTION OF THE PREFERRED EMBODIMENTS

FIGS. 5A–5D are bottom views showing BGA IC packages according to preferred embodiments of the invention.

Figure 1:
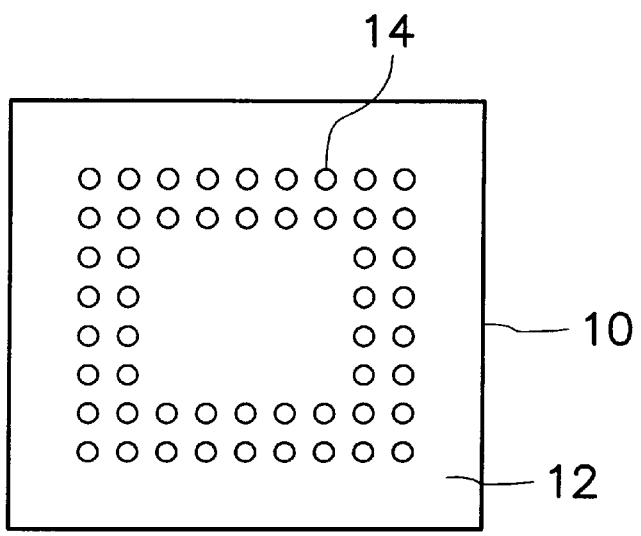
FIG. 1 is a bottom view showing a conventional BGA package.
Figure 2:
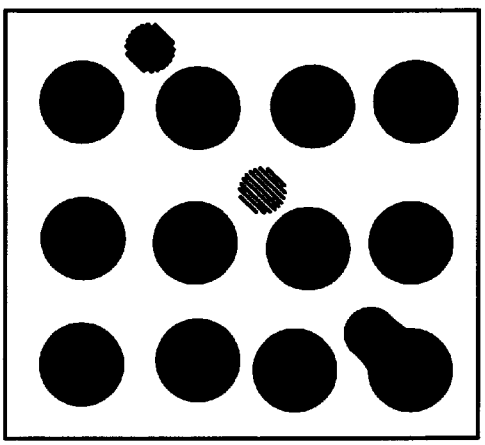
FIG. 2 is a schematic view showing a short circuit between tin balls formed beneath a BGA IC package.
Figure 3:
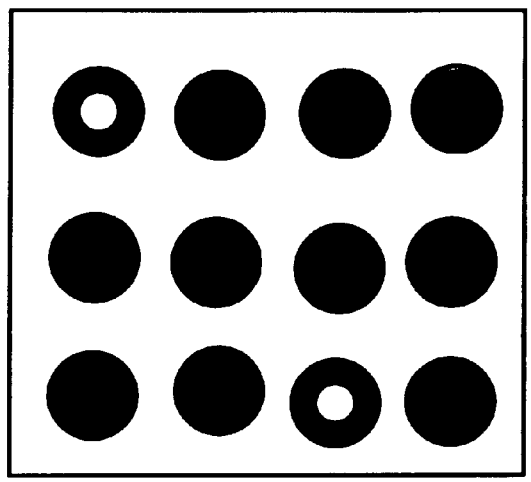
FIG. 3 is a schematic view showing non-contact soldering caused on tin balls beneath a BGA IC package.
Figure 4:
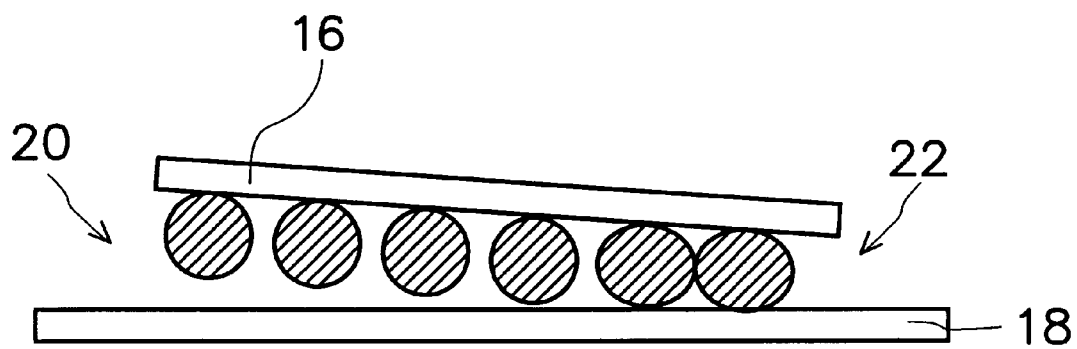
FIG. 4 is a side view showing a poor contact between a BGA IC and a PCB.
Figure 5A:
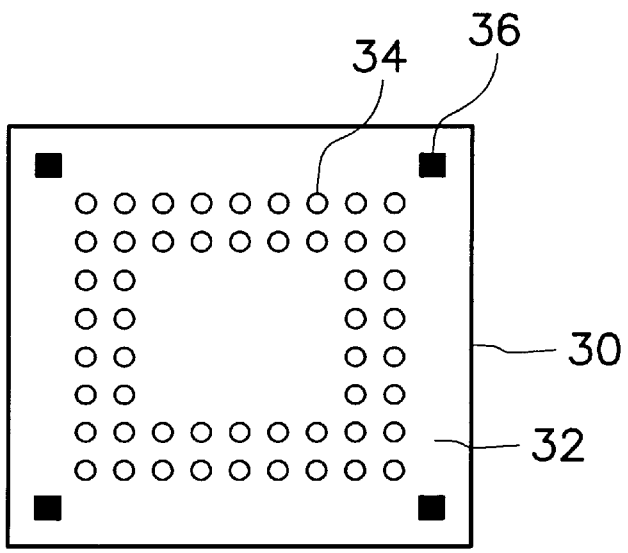
FIGS. 5A–5D are bottom views showing BGA packages according to preferred embodiments of the invention.

Referring to FIG. 5A, a plurality of ball-grid array tin balls 34 is formed on the rear surface 32 of a BGA IC package 30. four square supporting pads 36 are formed at the four corners of the rear surface 20, respectively. The height of each square supporting pad 36 is less than or about half the diameter of each ball-grid array tin ball 34. Furthermore, the melting point of the square supporting pads 36 is higher than that of the ball-grid array tin balls 34. The square supporting pads 36 can be made of aluminum with a high melting point and good heat conducting or resin. Since the square supporting pads 36 are formed at the four corners of the rear surface 32 of the BGA IC package 30, the BGA IC package 30 can be supported by the square supporting pads 36 when the tin balls 34 are melted during a nitrogen solder reflow treatment, thereby preventing non-contact soldering and short circuits. Moreover, due to the square supporting pads 36 with a higher melting point than the tin balls 34, the square supporting pads 36 are never melted during the nitrogen solder reflow treatment.

The square supporting pads 36 are not limited to be formed only at the 4 corners of the rear surface 32 of the BGA IC package 30. That is, the square supporting pads 36 can be formed at any positions of the rear surface 32 if arrangements can efficiently prevent non-contact soldering and short circuits when the BGA IC package 30 are mounted on a PCB.

Figure 5B:
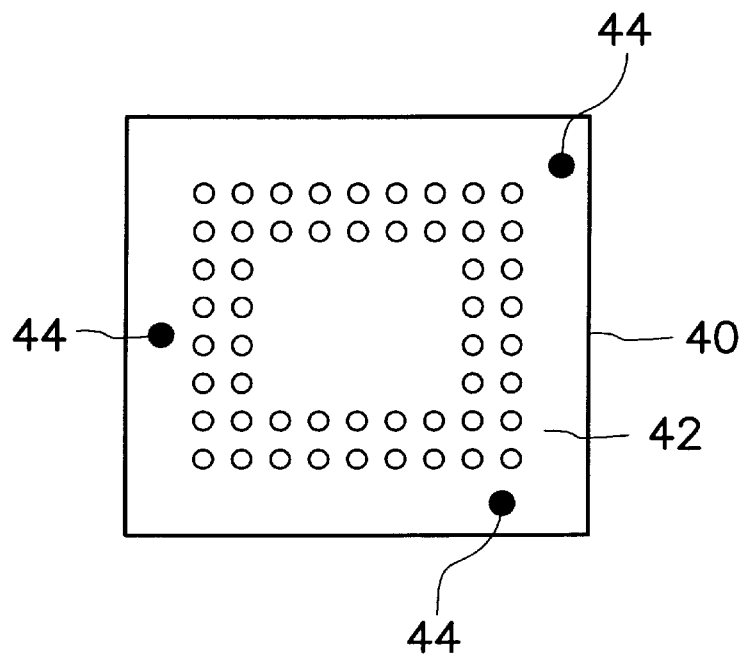

As an example shown in FIG. 5B, three circular supporting pads 44 are equally separated from each other and concentric with the rear surface 42 of the BGA package 40. Such arrangement can also attain the same object as stated above.

Figure 5C:
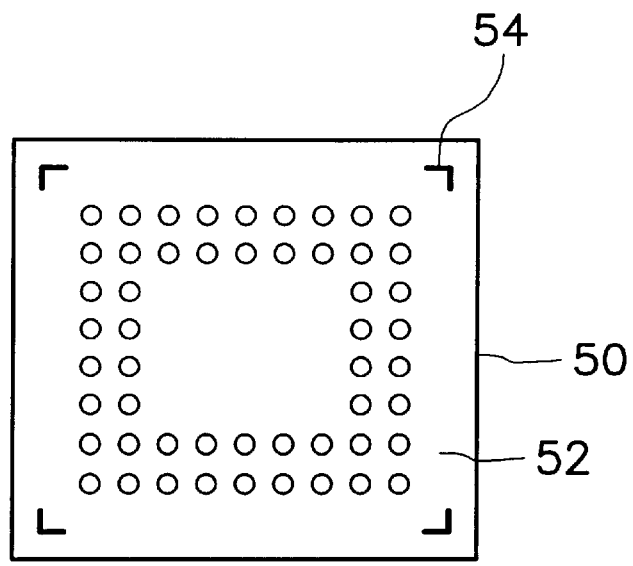

Referring now to FIG. 5C showing another example, four L-shaped supporting pads 54 are formed at the four corners of the rear surface 52 of a BGA IC package 50.

Figure 5D:
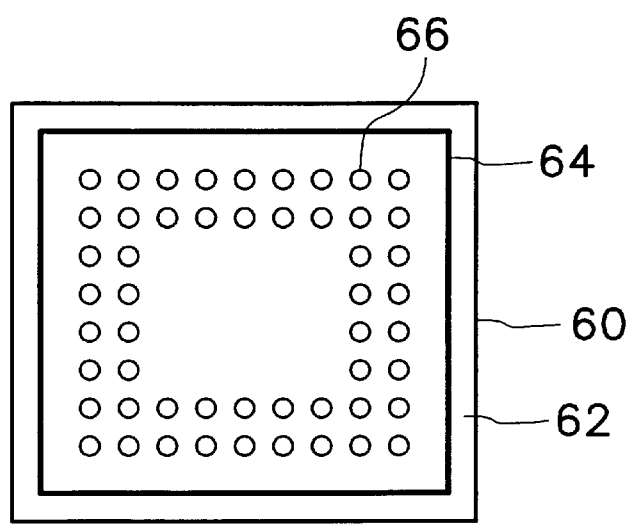
Figure 5E:
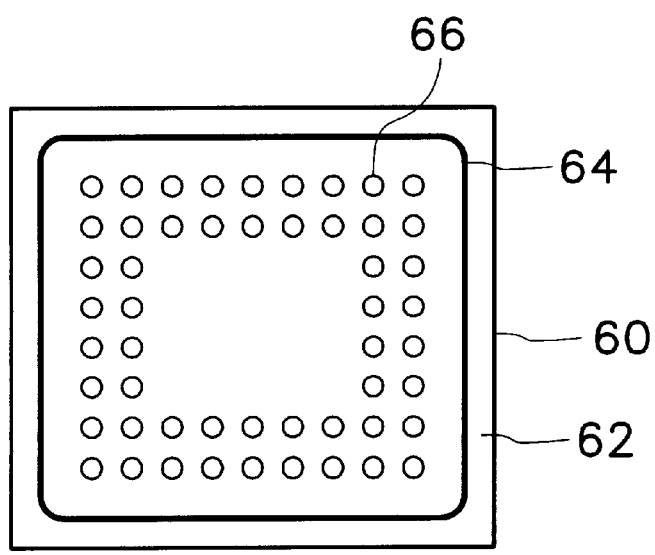
Figure 6:
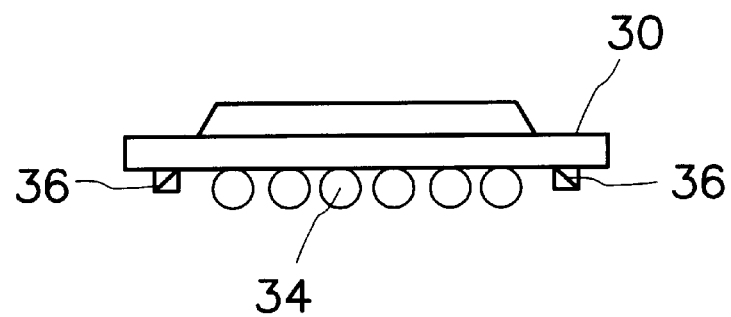
FIG. 6 is a side view showing a BGA IC package according to a preferred embodiment of the invention.

In addition, referring to FIGS. 5D–E, a supporting member 64, which can be round or square, is formed on the rear surface 62 of a BGA IC package 60 and surrounds ball-grid array tin balls 66.

All the supporting pads including the supporting member mentioned above can be of any shape, such as square, oblong, circular. Materials of the supporting pads and the supporting member can be identical to those used to package the BGA ICs. Moreover, the supporting pads and the supporting member can be concurrently formed during BGA IC packaging.

In summary, a BGA IC packaging frame having a plurality of supporting pads formed on the rear surface thereof according to the invention can efficiently prevent non-contact soldering and short circuits when a BGA IC package is mounted on a PCB. Furthermore, the BGA IC packaging frame of the invention still retains the four advantages as described in the prior art. The BGA integrated circuit package of the invention contributing to the yield improvement is thus widely adopted by the PCB manufactures.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A ball-grid array IC packaging frame comprising:
   a plurality of ball-grid array tin balls formed on the rear surface of a ball-grid array IC package; and
   a plurality of supporting pads formed on the surrounding of the rear surface of the ball-grid array IC package, wherein the height of each supporting pad is smaller than the height of each ball-grid array tin ball.

2. The ball-grid array IC packaging frame as claimed in claim 1, wherein the height of each supporting pad is approximately half the diameter of each ball-grid array tin ball.

3. The ball-grid array IC packaging frame as claimed in claim 1, wherein the number of the supporting pads is 4, formed at the 4 corners of the rear surface of the ball-grid array IC package, respectively.

4. The ball-grid array IC packaging frame as claimed in claim 3, wherein each supporting pad can be L-shaped.

5. The ball-grid array IC packaging frame as claimed in claim 1, the number of the supporting pads is 3, equally separated with each other and concentric with the rear surface of the ball-grid IC package.

6. The ball-grid array IC packaging frame as claimed in claim 1, wherein the supporting pads are formed between the ball-grid array tin balls and the perimeter of the rear surface of the ball-grid array IC package.

7. The ball-grid array IC packaging frame as claimed in claim 1, wherein the melting point of the supporting pads is higher than that of the ball-grid array tin balls.

8. The ball-grid array IC packaging frame as claimed in claim 1, wherein the supporting pads can be made of resin.

9. The ball-grid array IC packaging frame as claimed in claim 1, wherein the supporting pads can be made of aluminum with a high melting point and good heat conducting.

10. The ball-grid array IC packaging frame as claimed in claim 1, wherein the material of the supporting pads is the same as that of the ball-grid array IC package.

11. The ball-grid array IC packaging frame as claimed in claim 1, wherein the supporting pads can be concurrently formed during ball-grid array IC packaging.

12. The ball-grid array IC packaging frame as claimed in claim 1, wherein the supporting pads can be square.

13. A ball-grid array IC packaging frame comprising:
    a ball-grid array IC package;
    a plurality of ball-grid array tin balls formed on the rear surface of the ball-grid array IC package; and
    a supporting member formed between the perimeter of the rear surface and the ball-grid array tin balls for supporting and preventing the ball-grid array IC package from over inclination when mounted on a PCB.

14. The ball-grid array IC packaging frame as claimed in claim 13, wherein the height of the supporting member is approximately half the diameter of each ball-grid array tin ball.

15. The ball-grid array IC packaging frame as claimed in claim 13, wherein the supporting member has a higher melting point than the ball-grid array tin balls.

16. The ball-grid array IC packaging frame as claimed in claim 13, wherein the supporting member can be made of resin.

17. The ball-grid array IC packaging frame as claimed in claim 13, wherein the supporting member can be made of aluminum with a high melting point and good heat conducting.

18. The ball-grid array IC packaging frame as claimed in claim 13, the supporting member has the same material as the ball-grid array IC package.

19. The ball-grid array IC packaging frame as claimed in claim 13, wherein the supporting member can be concurrently formed during ball-grid array IC packaging.

20. The ball-grid array IC packaging frame as claimed in claim 13, wherein the supporting member can be circular.

21. The ball-grid array IC packaging frame as claimed in claim 13, wherein the supporting member can be square.

* * * * *